United States Patent [19]
Wallace et al.

[11] Patent Number: 6,143,634
[45] Date of Patent: Nov. 7, 2000

[54] SEMICONDUCTOR PROCESS WITH DEUTERIUM PREDOMINANCE AT HIGH TEMPERATURE

[75] Inventors: Robert M. Wallace, Richardson; Peijun Chen, Dallas, both of Tex.

[73] Assignee: Texas Instruments Incorporated, Dallas, Tex.

[21] Appl. No.: 09/123,828

[22] Filed: Jul. 28, 1998

[51] Int. Cl.[7] .............................................. H01L 21/3205
[52] U.S. Cl. ............................................ 438/585; 438/585
[58] Field of Search ........................................ 438/585, 586, 438/587, 588, 591; 257/607, 608, 609

[56] References Cited

U.S. PATENT DOCUMENTS 5,872,387  2/1999  Lyding et al. .......................... 257/607
5,972,765  10/1999  Clark et al. ............................ 438/308

OTHER PUBLICATIONS

Deuterium Post–Metal Annealing of MOSFET's for Improved Hot Carrier Reliability, IEEE Electron Device Letters, vol. 18, No. 3, Mar. 1997, pp. 41–43.

*Primary Examiner*—David Nelms
*Assistant Examiner*—Dung A Le
*Attorney, Agent, or Firm*—Carlton H. Hoel; W. James Brady; Frederick J. Telecky, Jr.

[57] ABSTRACT

Channel-hot-carrier reliability can be improved by deuterium passivation of the gate interface. By performing high temperature steps (above 300 degrees Celsius) in a deuterium-containing ambient, harmful depletion of deuterium due to diffusion away from the gate interface is avoided.

13 Claims, 1 Drawing Sheet

SEMICONDUCTOR PROCESS WITH DEUTERIUM PREDOMINANCE AT HIGH TEMPERATURE

BACKGROUND AND SUMMARY OF THE INVENTION

The present invention relates to fabrication of MOS transistors with reduced susceptibility to channel hot carrier effects, more specifically, to deuterium passivation of a gate interface.

Background: Deuterium Passivation

Hydrogen passivation of the dangling bonds which form electrically active interface traps improves device function, but hydrogen passivation can be degraded by subsequent hot electron impact. Recent results have shown that passivation with deuterium instead of hydrogen in the post-metal anneal process is more stable and therefore less likely to succumb to hot electron degradation, resulting in an improvement in channel hot carrier lifetime of 10–100×. I. C. Kizilyalli et al., "Deuterium Post-Metal Annealing of MOSFET's for Improved Hot Carrier Reliability," 18 IEEE Electron Device Letters, 81 (1997); J. W. Lyding et al., "Reduction of Hot Electron Degradation in Metal Oxide Semiconductor Transistors by Deuterium Processing," 68 Applied Physics Letters 18 (1996); 68 Applied Physics Letters 2526 (1996); C. G. Van de Walle and W. B. Jackson, "Comment on 'Reduction of hot electron degradation in metal oxide semiconductor transistors by deuterium processing'"; Applied Physics Letters 69 (1996) 2441, all of which are hereby incorporated by reference.

Published work on deuterium sintering to date has been done on devices that have been pulled after the metal-1 metallization step. However, typical process flows for conventional CMOS devices require many additional levels of metallization and isolation dielectric steps which are performed at high temperatures. On the average, Si—H or Si—D bonds are broken at temperatures between 500 degrees Celsius and 550 degrees Celsius although a smaller portion of these bonds may be broken at lower temperatures (e.g., down to about 300 degrees Celsius). Once free, deuterium and hydrogen are mobile and are expected to diffuse from interfacial trap sites. Thus, the subsequent thermal processing is likely to destroy any beneficial effects from the early sintering process.

Semiconductor Process with Deuterium Predominance at High Temperatures

The disclosed approach for avoiding harmful deuterium diffusion during steps executed at temperatures likely to break Si—H/Si—D bonds is to perform non-oxidizing steps which require temperatures greater than 300 degrees Celsius (or other threshold temperature) predominantly in a deuterium-enriched atmosphere (e.g., N2:D2=90:10). By providing a deuterium-enriched ambient at the lowest temperatures where hydrogen depassivation is significant, potential replacement of hydrogen with deuterium is maximized.

The advantages of providing a deuterium-enriched environment during these high temperature steps include:

compensating for depletion of deuterium from diffusion away from the gate oxide interface traps;

minimizing any adverse affects on passivation due to thermal processing steps; and improving hot-channel-carrier reliability.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of High Temperature Processing Steps in a Deuterium Atmosphere

Figure 1:
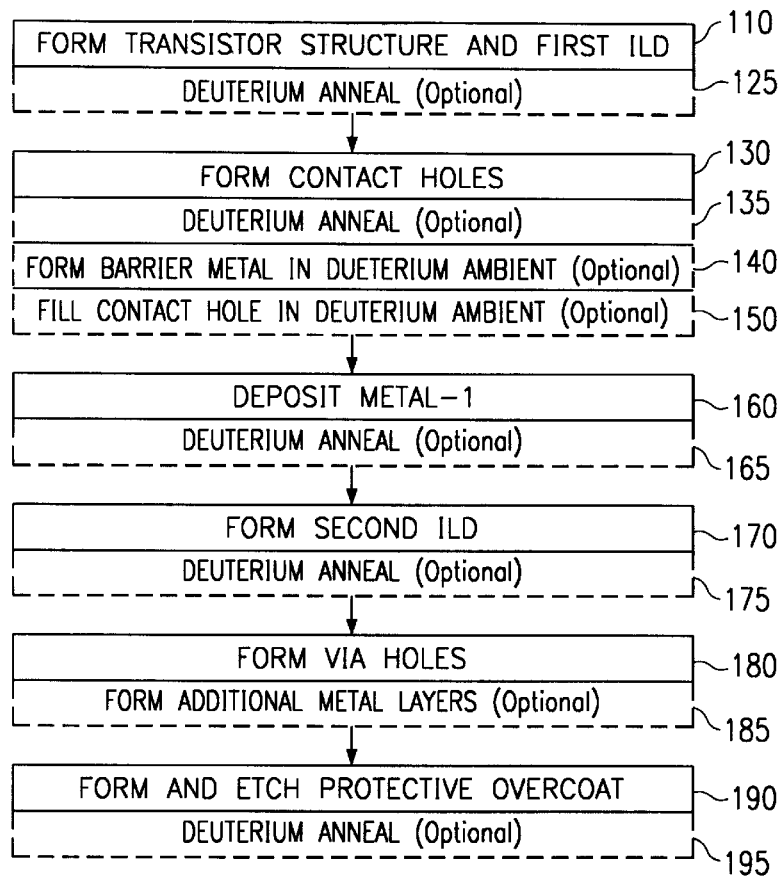
FIG. 1 shows a process flow for fabricating an integrated circuit device by the disclosed method.

The steps shown in FIG. 1 will now be discussed in an overview of fabrication of a device in which steps performed above 300 degrees Celsius are performed in a deuterium-enriched ambient. Thus, it will be appreciated that, while specific steps can be omitted, it is preferred that any steps performed above 300 degrees Celsius should employ the deuterium-enriched ambient. The steps in FIG. 1 will be discussed with reference to FIG. 2. Specific examples and details, such as time and temperature, are provided below in the discussion of a sample embodiment, however, these values can be adjusted.

A transistor structure is formed, including source, drain and gate structures, with materials and processes known in the art, at step 110. The transistor structure may have optional components which are readily apparent to those skilled in the art.

When transistors are complete, a first interlevel dielectric 280 and 290 is formed over and across the entire substrate. This completes step 110.

At optional step 125, the structure is annealed in a deuterium ambient.

Contact holes through the first interlevel dielectric are then formed at step 130.

After contact holes are formed, an optional deuterium anneal may be performed to complete optional step 135.

A barrier metal layer 300 is next formed to partially fill the contact holes. Barrier metal 300 may be formed in a deuterium-enriched ambient to complete optional step 140.

A plug 305 for the contact hole is then formed. Plug 305 may be formed in a deuterium-enriched ambient to complete optional step 150.

Metal-1 310 is then deposited at step 160, followed by a deuterium anneal (if desired) to complete optional step 165.

A second interlevel dielectric 320 is formed over metal-1 to complete step 170. If desired, a deuterium anneal may now be performed to complete optional step 175.

Via holes through the second interlevel dielectric are then formed. This completes step 180.

If desired, additional metal layers may be formed at optional step 185. To form optional additional metal layers, steps 135–175 would be repeated until the number of metal layers desired has been formed.

Once the desired number of metal layers has been formed, a protective overcoat is formed over the entire structure to complete step 190. The structure may then undergo a final deuterium anneal to complete optional step 195.

Sample Embodiment

Figure 2:
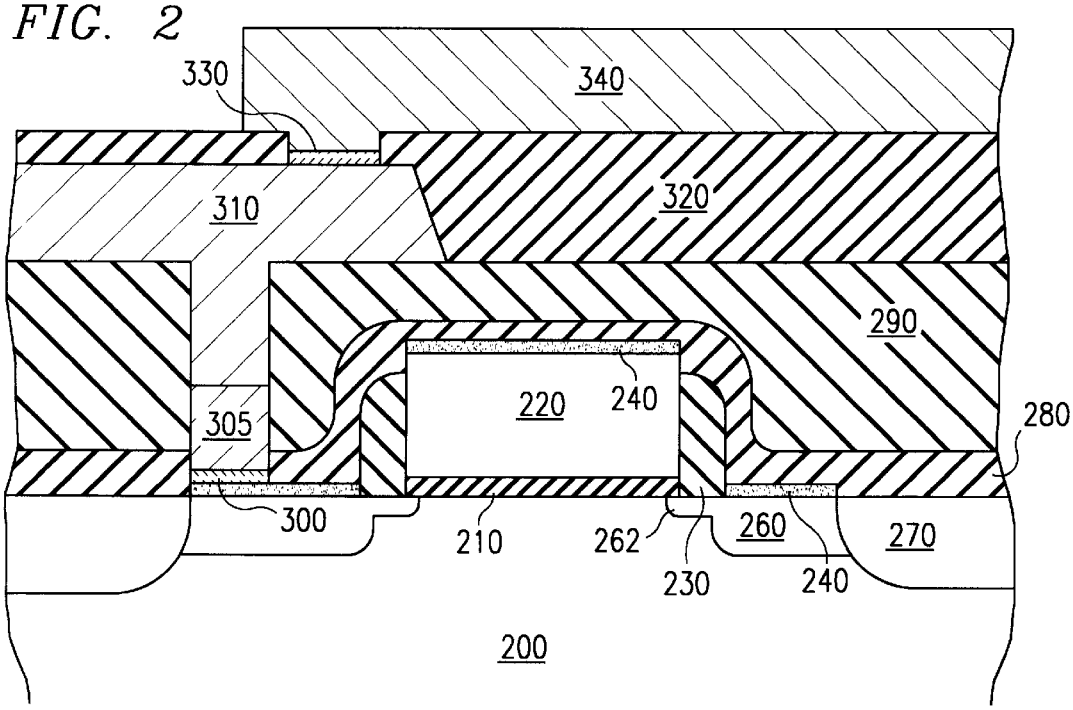
FIG. 2 shows a structure formed according to the disclosed method.

FIG. 2 will now be discussed in detail with reference to specific steps in a sample process embodiment. The following steps illustrate deuterium-enriched processing in the formation of an integrated circuit.

A transistor structure comprising silicon substrate 200, source/drain regions 260, shallow S/D extensions 262, shallow trench isolation structures 270, a gate 220, a gate oxide 210, and sidewall spacers 230, as shown in FIG. 2 were formed by methods and from materials known in the art.

In preparation for forming contact holes, silicide layer 240 was formed on silicon substrate 200 adjacent to the sidewall spacers 230 and on gate 220. A non-doped silicate glass (NSG) layer 280 30 nanometers thick was deposited under Atmospheric-Pressure-Chemical-Vapor Deposition (APCVD) conditions. A borophosphosilicate glass (BPSG) interlevel layer 290, was then deposited over NSG layer 280. This completes step 110.

NSG layer 280 and BPSG layer 290 were then densified at 700 degrees Celsius for 50 minutes in a deuterated ambient. The minimum recommended ratio of $D_2:N_2$ during densification is 1%:99%. The maximum ratio is 100% deuterium. This completes optional step 125.

The structure was then planarized and a contact hole was selectively etched through BPSG layer 290, but stopped when it reached silicide layer 240. This completes step 130.

After contact hole formation, but before barrier metal deposition, the structure was sintered at 450 degrees Celsius for 30 minutes in a 90% $N_2$:10% $D_2$ ambient. This completes-optional step 135.

Deposition of barrier metal 300 (Ti and TiN) was followed by a deuterium anneal which caused silicide layer 240 to undergo a phase change to its most conductive form. The anneal was for one hour at 585 degrees Celsius in a 90% $N_2$:10% $D_2$ ambient in this sample embodiment. This completes optional step 140.

The contact hole is then filled by a nucleated Chemical-Vapor-Deposition (CVD) tungsten via plug 305. The filling ambient in this sample embodiment was 2400 ccm of argon, 500 ccm of deuterium, 250 ccm of nitrogen, and 75 ccm tungsten-hexafluoride at 475 degrees Celsius and a pressure of 80 Torr. This completes optional step 150.

Tungsten contact plug 305 was then etched back, and metal-1 layer 310 was deposited. Metal-1 310 in this sample embodiment was electromigration resistant aluminum alloy (e.g., Al:Si:Cu). This completes step 160.

The structure was then sintered at 435–450 degrees Celsius for 30–120 minutes (preferably 30) in a 90% $N_2$:10% $D_2$ ambient. This completes optional step 165.

A second interlevel dielectric layer 320 was then deposited over and across the entire structure, including metal-1 layer 310, to complete step 170. Second interlevel dielectric layer 320 was then densified at 400 degrees Celsius for 60 minutes in a deuterated ambient. The minimum recommended ratio of $D_2:N_2$ during densification is 1%:99%. The maximum ratio is 100% deuterium. A further barrier layer 330 is then deposited, and second metal layer 340 is then deposited and patterned. This completes optional step 175.

The structure was then planarized, and via holes were patterned and etched to complete step 180. A further barrier layer 330 is then deposited, and second metal layer 340 is then deposited and patterned. At optional step 185, additional metal layers were formed in this sample embodiment. Steps 135 through 175 were repeated and performed as discussed above, until metal-3 (and possibly metal-4 and metal-5) layer(s) have been patterned, deposited, and etched.

At step 190, a Protective Overcoat (PO) of CVD silicon dioxide was patterned and deposited so as to expose only metal-3 regions. Sintering was then performed in 90% $N_2$:10% D2 at 435 degrees Celsius for 30 minutes. This completes optional step 195.

In this sample embodiment, step 190 was then repeated, with an additional protective overcoat comprising CVD silicon dioxide followed by a protective overcoat of plasma deposited silicon nitride. Optional step 195 was also repeated with a final sinter in 90% $N_2$:10% D2 at 435 degrees Celsius for 30 minutes.

Alternative Embodiment: Lower Deuterium Concentration

In practice, significant benefits are predicted when the ambient contains as little as 1% deuterium. Other conditions remain like those stated above.

Alternative Embodiment: Silicon-Germanium Active Area

Note that a silicon-germanium semiconductor active area rather than the silicon semiconductor active area 200 in the sample embodiment may be used. Other conditions remain like those stated above.

According to a disclosed class of innovative embodiments, there is provided: A integrated circuit fabrication method, comprising the steps of: (a.) fabricating an active semiconductor device structure including a conductive gate material on a gate dielectric; and (b.) after said step (a.), completing fabrication of an integrated circuit; wherein said step (b.) includes a plurality of sub-steps which are each performed in a respective non-oxidizing ambient above a predetermined temperature which is greater than 250 degrees Celsius; and wherein the compositions of said respective ambients, averaged over the total duration of said sub-steps above said predetermined temperature, include at least 1% atomic of deuterium.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to processes with two, three, or more layers of polysilicon or polycide.

It should also be noted that the number of layers of metallization described above does not implicitly limit any of the claims, which can be applied to processes and structures with more or fewer layers.

Similarly, it will be readily recognized that the described process steps can also be embedded into hybrid process flows, such as BiCMOS or smart-power processes.

It should also noted that more or less components than are shown in the sample embodiment may form the transistor structure itself. Many variations in design are known in the art, and are compatible with the disclosed process.

While the temperatures used in the sample embodiment were above 300 degrees Celsius, similar benefits are predicted for target temperatures slightly lower or higher than 300 degrees Celsius. (The temperature of 300 Celsius, which is used in the presently preferred embodiment to determine which steps need to be deuterium-enriched, was selected in view of the statistical likelihood of bond scission, so that only a very small fraction of bonds will be depopulated below this temperature. However, other temperature criteria can be used instead. Lower temperatures will provide more thorough protection, while increasing cost; higher temperatures will provide less complete deuteration while reducing cost. Thus, for example, in one alternative embodiment, all processes performed above 250 degrees Celsius, can be candidates for execution in a deuterium ambient.

Nitrogen is a convenient carrier gas for deuterium, and increases safety. However, other source gas mixtures can alternatively be used to provide deuterium flow.

Rather than having a hydrogen-free deuterated ambient during sintering, as in the sample embodiment, a less completely deuterated ambient can alternatively be used. This is less preferred, but does serve to reduce cost, and may still obtain some of the benefits of the preferred embodiment.

Optimally, no hydrogen is present during high temperature steps, but benefits are predicted as long as deuterium is present in the overall net majority of processing steps (with respect to time). For example, when the deuterium/hydrogen ratio is integrated over all processing steps performed in a non-oxidizing atmosphere at or above a predetermined temperature (e.g., 300 degrees Celsius), the result is a net deuterium/hydrogen ratio greater than one. The impurity of hydrogen and hydrogen-deuterium should be minimized (less than 3000 ppm total), but benefits may be obtained with other concentrations.

What is claimed is:

1. An integrated circuit fabrication method, comprising the steps of:
    (a.) fabricating an active semiconductor device structure including a conductive gate material on a gate dielectric; and
    (b.) after said step (a.), completing fabrication of an integrated circuit including multiple levels of interconnects;
    (c.) wherein said step (b.) includes a plurality of sub-steps which are each performed in a respective non-oxidizing ambient above a predetermined temperature which is greater than 250 degrees Celsius;
    (d.) and wherein the compositions of all of said respective ambients include at least 1% atomic of deuterium.

2. The integrated circuit fabrication method of claim 1, wherein said step (b.) comprises the sub-steps of:
    (b1.) forming a first interlevel dielectric layer over said active semiconductor device structure; and
    (b2.) next after said sub-step (b1.), annealing at or above said predetermined temperature in an atmosphere containing at least 1% atomic of deuterium.

3. The integrated circuit fabrication method of claim 1, wherein the compositions of said respective ambients, averaged over the total duration of said sub-steps above said predetermined temperature, include at least 10 deuterium molecules for every hydrogen molecule.

4. The integrated circuit fabrication method of claim 1, wherein said step (b.) comprises the sub-steps of:
    (b1.) forming a first interlevel dielectric layer having contact holes therein over said active semiconductor device structure; and
    (b2.) next after said sub-step (b1.), annealing at or above said predetermined temperature in an atmosphere containing at least 1% atomic of deuterium.

5. The integrated circuit fabrication method of claim 1, wherein said step (b.) comprises the sub-steps of:
    (b1.) forming a first interlevel dielectric layer having a first contact hole, over said active semiconductor device structure; and
    (b2.) forming a contact plug partially filling said first contact hole at or above said predetermined temperature in an atmosphere containing at least 1% atomic of deuterium.

6. The integrated circuit fabrication method of claim 1, wherein said step (b.) comprises the sub-steps of:
    (b1.) forming a first interlevel dielectric layer having a first contact hole, over said active semiconductor device structure;
    (b2.) forming a first metal layer to fill said first contact hole; and
    (b3.) annealing at or above said predetermined temperature in an atmosphere containing at least 1% atomic of deuterium.

7. The integrated circuit fabrication method of claim 1, wherein said step (b.) comprises the sub-steps of:
    (b1.) forming a first interlevel dielectric layer having a first contact hole, over said active semiconductor device structure;
    (b2.) forming a first metal layer to fill said first contact hole;
    (b3.) forming a second interlevel dielectric layer over said first metal layer; and
    (b3.) annealing at or above said predetermined temperature in an atmosphere containing at least 1% atomic of deuterium.

8. The integrated circuit fabrication method of claim 1, further comprising the step of:
    (c.) annealing at or above said predetermined temperature in an atmosphere containing at least 1% atomic of deuterium after fabrication of said integrated circuit is substantially complete.

9. The integrated circuit fabrication method of claim 1, wherein: an atmosphere containing at least 1% atomic of deuterium is present during substantially all of said total duration of said sub-steps.

10. The integrated circuit fabrication method of claim 1, wherein said predetermined temperature is 300 degrees Celsius.

11. The integrated circuit fabrication method of claim 1, wherein at least some ones of said substeps are performed in an atmosphere containing deuterium gas, with less than 3000 ppm deuterium-hydrogen and hydrogen impurities, mixed with an inert source gas.

12. The integrated circuit fabrication method of claim 1, wherein at least some ones of said substeps are performed in an atmosphere containing 90% atomic of nitrogen and 10% atomic of deuterium.

13. The integrated circuit fabrication method of claim 1, wherein at least some ones of said substeps are performed in an atmosphere containing 95% atomic of nitrogen and 5% atomic of deuterium.

* * * * *

UNITED STATES PATENT AND TRADEMARK OFFICE
CERTIFICATE OF CORRECTION

PATENT NO.    : 6,143,634
DATED         : November 7, 2000
INVENTOR(S)   : Robert M. Wallace and Peijun Chen It is certified that error appears in the above-identified patent and that said Letters Patent is hereby corrected as shown below:

<u>Title page,</u>
Insert -- [60] Related U.S. Application Data
      Provisional Application No. 60/054,000 filed 07/28/1997. --

Signed and Sealed this

Twenty-fifth Day of February, 2003

JAMES E. ROGAN
*Director of the United States Patent and Trademark Office*